United States Patent [19]
Robillard

[11] 3,957,515
[45] May 18, 1976

[54] PHOTOGRAPHIC PROCESS FOR PRODUCING COLORED POLYMERIZED IMAGES

[75] Inventor: Jean-Jules Robillard, Ferney Voltaire, France

[73] Assignee: La Cellophane, Paris, France

[22] Filed: Mar. 14, 1975

[21] Appl. No.: 558,494

[30] Foreign Application Priority Data
Mar. 15, 1974  France ............................. 74.08806

[52] U.S. Cl. ............................. 96/48 HD; 96/27 R; 96/48 R; 96/90 R; 96/90 PC; 96/115 P; 96/115 R; 354/3 DD; 355/3; 355/7; 427/45; 427/56
[51] Int. Cl.² ..................... G03C 5/24; G03C 5/04; G03C 1/68
[58] Field of Search ............ 96/48 R, 48 HD, 27 R, 96/90 R, 115 P, 115 R, 90 PC, 35.1; 427/4 Y, 56

[56] References Cited
UNITED STATES PATENTS
| | | |
|---|---|---|
| 3,667,949 | 6/1972 | Inoue et al. ..................... 96/90 PC |
| 3,707,379 | 12/1972 | Hayakawa et al. ..................... 96/48 |
| 3,816,137 | 6/1974 | Takegawa et al. ..................... 96/67 |
| 3,816,139 | 6/1974 | LeClair ..................... 96/67 |

Primary Examiner—Jack P. Brammer
Attorney, Agent, or Firm—Sherman & Shalloway

[57] ABSTRACT

A photosensitive composition including a photopolymerizable monomer system and a thermochromic substance which can be used in a photographic reproduction process which avoids the use of liquid elements for developing and fixing. The process is based on the different dielectric constants and heat losses exhibited by a monomer and the corresponding polymer and the reaction of certain thermochromic substances which exhibit a specific threshold temperature above which these substances change from a colorless form to a colored, stable form. The photosensitive element is exposed according to an original having image areas and non-image areas with a light source to cause polymerization in areas corresponding to the transparent areas of the original to form a latent image of polymerized zones and unpolymerized zones; the exposed photosensitive elements are developed by passing through a high frequency electric field which raises the temperature of the polymerized zones by dielectric heating to above the color threshold temperature of the thermochromic substance. Apparatus for carrying out the process is also described.

1 Claim, 1 Drawing Figure

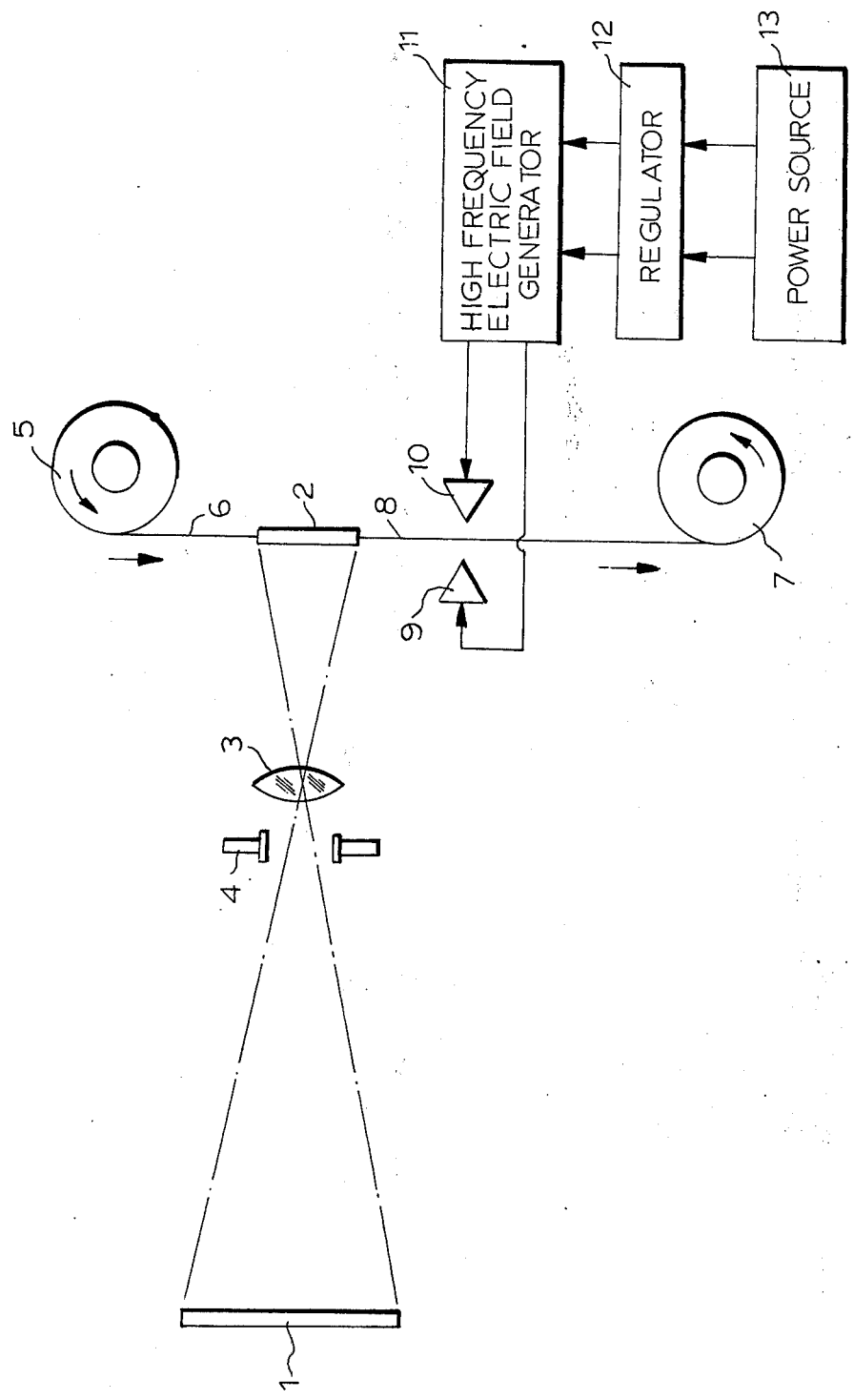

PHOTOGRAPHIC PROCESS FOR PRODUCING COLORED POLYMERIZED IMAGES

BACKGROUND OF THE INVENTION

1. Field of the Invention

This invention relates to a novel photographic reproduction process, a photosensitive composition and photosensitive element to be used in the process and to apparatus used in practicing the photographic process. More specifically, the present invention relates to a dry physical development photographic process based on a photosensitive composition which includes a photopolymerizable monomer and a thermochromic substance and to the apparatus for carrying out this process.

2. Prior Art

Most photographic processes that allow production of a permanent image are based on photochemical reactions and require use of liquid chemical agents to develop and fix the image. This is the case especially in the conventional silver process in which a silver halide is used as the photosensitive compound.

As a result of the need to have recourse to liquid agents to develop and fix the silver image these baths will become depleted of their active ingredients, or modify in the course of use; this necessitates frequent changing or supplementing of the baths. This drawback is particularly bothersome in automatic facilities, because there has to be constant monitoring and maintenance of these baths. This drawback is especially troublsome, for example, in facilities that deliver identification photos at a moderate cost. It would thus be desirable to have a photographic process that would avoid the use of liquid agents for development and fixing.

There are photographic processes that do not use silver, namely processes that are based on a photopolymerization reaction. Such processes would allow high sensitivity, of the order of ASA 200. Theoretically they could be substituted for the conventional silver process, but they do not directly produce a visible image, and require a developing operation. It is this that has thus far limited their use.

For example, British Patent 905,182 discloses coatings capable of being converted to imagewise photopolymerized resists from a compound containing the

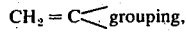

in which an oil-soluble colorant such as dye or pigment is dispersed. The light sensitive material is exposed under a pattern to white-light. Where the light passes through the pattern, photopolymerization of the light-sensitized material takes place to produce hydrophobic areas. The light-sensitized material is then subjected to the action of a hydrophilic solvent such as water, alcohol or the like for a matter of seconds to remove the unexposed unpolymerized areas.

British Patent 980,286 discloses a photographic element comprising a support having coated thereon a photosensitive layer comprising a photographic colloid carrier having dispersed therein a normally liquid or solid dispersible monomer containing the grouping $CH_2=C=$, a substantially water insoluble carboxylic aliphatic acid having from 10 to 27 carbon atoms inclusive and a light-sensitive ferric salt. The aforesaid light-sensitive element is then exposed to visible light through a pattern or a suitable optical image, the exposed element then developed by contacting with a per compound containing the grouping —O—O— whereby polymerization takes place in those areas of the element which were exposed. In the unexposed portions of the plate, there is no reaction, and the monomer remains unpolymerized. The residual unpolymerized portions of the coating are removed by washing which leaves intact the polymeric resist image corresponding to the exposed areas. The washed plate is next inbibed or steeped in a solution of basic dye which has a strong affinity or substantivity for the polymeric image containing the dispersed higher fatty acid.

U.S. Pat. No. 2,760,863 discloses a process for preparing relief images for direct use as printing plates "by exposing with actinic light through a process transparency . . . a photopolymerizable layer or stratum comprising a polymerizable ethylenically unsaturated composition (e.g. a compound or mixture of compounds) having intimately dispersed therethrough an addition polymerization initiator activatable by actinic light, [the] layer or stratum being superposed on a suitable adherent support, i.e., adherent to the photopolymerized composition, until substantially complete polymerization takes place in the exposed areas and substantially no polymerization takes place in the non-exposed areas, and essentially completely removing the layer, e.g. the unpolymerized composition together with any admixed material, in [the] non-exposed areas."

It can be seen that the conventional reproduction processes based on a photopolymerization reaction still require difficult and uneconomical development and fixing steps.

SUMMARY OF THE INVENTION

The present invention overcomes the foregoing deficiencies of the prior art photographic processes and photosensitive elements by providing a photographic process and photosensitive composition that does not require the use of liquid agents to develop or fix the image. Briefly, the process of the present invention involves a photopolymerization reaction to form a latent image, and a physical process development.

The present invention provides a process for forming a positive or negative reproduction of an original which has image areas of varying degrees of intensity. This process takes advantage of the different dielectric constants and heat losses exhibited by a monomer (or a mixture of monomers) and the corresponding polymer (or copolymer) and the reaction of certain thermochromic substances which exhibit a specific threshold temperature above which these substances change from a colorless or substantially colorless form to a colored, stable form.

According to the process of the present invention, a photosensitive element comprised of a photopolymerizable monomer system and a thermochromic substance, in one or two layers, carried on a suitable substrate, is exposed, according to an original having image areas and non-image areas with a light source to cause polymerization of the monomer system in areas corresponding to the transparent areas of the original (in a negative reproduction the image areas of the original are non-transparent and the non-image areas are transparent; similarly, in a positive reproduction the image areas of the original are transparent and the non-image areas are non-transparent); thereby forming a latent image of polymerized zones and unpolymerized zones; the exposed photosensitive element is then developed by passing it through a high frequency electric field wich raises the temperature of the polymerized zones by dielectric heating to above the coloration threshold temperature of the thermochromic substance which changes from a colorless or substantially colorless form to a stable, colored form.

The present invention further provids a photosensitive composition which includes a photopolymerizable monomer system and a thermochromic substance having the property that at a specific temperature (hereinafter referred to as color threshold temperature or more simply, a color threshhold or threshold temperature) it undergoes a transformation from a colorless or only very weakly colored form to a colored, stable form.

There is also provided, according to the present invention, a photosensitive element which can be used in the photographic process of the present invention, such element including a coating of the above described photosensitive composition on a suitable substrate. The photosensitive composition may be applied to the substrate as a single layer or as a layer of the photopolymerizable monomer system and a second layer of the thermochromic substance.

The present invention also provides a novel system for performing the foregoing photographic process. According to the present invention an apparatus is provided which includes light exposure means for exposing the photosensitive element to a light source; film transport means including a supply reel and a take-up reel; and means for applying a high frequency electric field to the exposed photosensitive element.

The light exposure means can be any conventional exposure device used for the formation of a photographic image and would typically include a light source, shutter system and lens system.

Similarly, the film transport means includes a supply source for the unexposed film and a take-up mechanism for the exposed film. The supply source and take-up mechanism are arranged to carry the film passed the exposure means and then through a high frequency electric field at a predetermined rate of speed for development of the latent image.

The high frequency electric field is applied across two electrodes, for example, silver coated brass electrodes, through which the exposed film (photosensitive element) containing the latent image of polymer and monomer of different dielectric constants passes for a time sufficient to heat only the polymerized zones to a temperature above the color threshold of the thermochromic substance contained therein. The electrodes are connected to a suitable generator which generates the high frequency electric field of adjustable intensity. The generator is controlled by a regulator and power source according to well known means.

The present invention will now be described in greater detail in connection with the accompanying Figure which is a schematic illustration of one embodiment of the photographic system used in carrying out the process of the present invention.

Dielectric heating is the term applied to the generation of heat in non-conducting materials by their losses when subject to an alternating electric field of high frequency. In practice the non-conducting load is placed between two electrodes across which the high-frequency voltage is applied.

In this connection, it is recalled that the amount of heat produced per second Q when a dielectric layer is subjected to a high frequency electric field, because of dielectric losses, is given by the known formula:

$$Q = 5.91 \; Sf \frac{E^2}{d} \epsilon_g \delta \; 10^{-12} \qquad \text{I}$$

where
 $S$ = surface of the layer in $m^2$
 $f$ = frequency of the electric field in cycles/second
 $E$ = voltage at the electrode terminals, in volts
 $\epsilon$ = dielectric constant of the material of the layer
 $\delta$ = loss angle (power factor)
 $d$ = thickness of the layer This amount of heat, Q, results in an increase in temperature of the layer given by the formula:

$$T - T_0 = Q/mtc \qquad \text{II}$$

where
 $T$ = temperature of the layer after heating in °C
 $T_0$ = ambient temperature, in °C
 $m$ = mass of material in the layer, in g
 $c$ = specific heat of the material, in cal/g
 $t$ = duration of application of the high frequency electric field in sec.

See, for example: Brown G. H., Hoyler C. N. and Bierwirth R. A., Theory and Application of Radiofrequency Heating (1947), Cable J. W., Induction and Dielectric Heating (1947).

The present invention takes advantage of the large differences in the dielectric constant of a photopolymerizable monomer (or mixture of such monomers) and the corresponding polymer (or copolymer) in order to differentially heat a latent image containing polymer in exposed regions and monomer in unexposed regions. The polymer will be heated to a temperature above the color threshold temperature of a thermochromic substance present in the photosensitive element to thereby develop the latent image.

It can be seen from formula (I) and formula (II) that if the difference $\Delta E$ in the dielectrric constant $\epsilon$, of the polymer and the dielectric constant $\epsilon_2$ of the monomer, where $\Delta \epsilon = \epsilon_1 - \epsilon_2$ is sufficiently great, than upon proper selection of parameters, e.g. frequency, time, etc., it becomes possible to heat the exposed polymerized zones to a higher temperature than the unpolymerized, unexposed monomer zones. Accordingly, a temperature gradient can readily be created between the polymerized zones and unpolymerized zones such that the coloration of the thermochromic substance will be produced in the polymerized zones but not in the unpolymerized zones.

Within the scope of the present invention any photopolymerizable system can be used, whether based on a process of homopolymerization or of copolymerization, such that the difference $\Delta \epsilon$ between the dielectric constants $\epsilon_1$ of the polymerized zones and $\epsilon_2$ of the unpolymerized zones, will be sufficient to allow heating of the polymerized zones which is substantially greater than that of the unpolymerized zones when a high frequency electric field is applied to the photographic element, which has been previously exposed according to an image. It is only necessary that the polymerized zones be brought by the dielectric heating to a temperature $T_1$ which is higher than the threshold temperature Tc of the thermochromic substance in the photosensitive element, while the unpolymerized zones must remain at a temperature $T_2$ which is below the temperature $T_c$.

Satisfactory results are obtained when $\Delta\epsilon$ is at least 20% of $\epsilon_1$, i.e. $\Delta\epsilon > 0.2\epsilon_1$.

All known photopolymerizable systems will provide a $\Delta\epsilon$ meeting the requirement for sufficient differential dielectric heating, i.e. $T_1 > T_c$ in exposed polymerized areas and $T_2 < T_c$ in unexposed unpolymerized areas, if complete polymerization is obtained. Of course, for some photopolymerizable systems and thermochromic substances, it may not be necessary to have complete polymerization in the exposed areas, but for best results the exposure conditions will be sufficient to provide substantially total or total polymerization of the exposed areas.

Some examples of the photopolymerizable systems which can be used in the present invention include the following well known photopolymerizable monomers: acrylic monomers, vinyl monomers, styrene resins, ethylene oxide, diacrylic monomer of polyethylene glycol, N-vinylcarbazole, (meth)acrylamide, acrylates of barium, sodium and lead, vinyl acetate, vinyl sorbate, vinyl acetal ester, cellulose acetate and cellulose hydrogenaphthalate, cellulose alkyl esters, polyethane alkylene ether glycol, hexamethylene adipamide, β-diethyl aminoethylmethacrylate, chlorophene, etc.

In general, any of the known photopolymerizable systems such as those described in the following British and U.S. Patent Nos. can be used in the present invention: British Patents 905,182 and 980,286; U.S. Pat. Nos. 2,760,863, 2,850,445, 2,875,047, 3,060,026, 3,070,442, 3,081,168, 3,097,096, 3,244,518, 3,353,955, 3,406,067 and 3,409,431. Typically, the photopolymerizable monomer system is based on an ethylenically unsaturated, addition-polymerizable monomer and a photopolymerization initiator or catalyst, both either singly or in combination with one or more other similar monomers and initiators.

The photopolymerizable monomers which are often liquid at room temperature, will usually be dispersed in a suitable binder. Examples of suitable binders include both thermoplastic and thermosetting substances such as polyvinyl alcohol, hydroxyethyl cellulose, styrene-butadiene copolymer, gelatin, phenolic resin, melamineformaldehyde resins, casein, carboxymethyl cellulose, etc.

Any of the well known photoinitiators or polymerization catalysts can be used in the photosensitive compositions of the present invention. Where high polymerization rates are not critical or where the reaction conditions and photosensitive compositions are such that high polymerization rates will be obtained in the absence of a catalyst or photoinitiator then these components can be excluded from the compositions.

Examples of free-radical generating addition polymerizable initiators activatable by actinic light are well known, several types of organic and inorganic catalysts and initiators being disclosed in the above mentioned patents, particularly Heiart, U.S. Pat. No. 3,060,026, Cohen et al, U.S. Pat. No. 3,070,442, Leekly et al, U.S. Pat. No. 3,081,168 and Schwerin et al, U.S. Pat. No. 3,244,518. A particularly preferred catalyst is sodium paratoluene sulfinate.

The amount of photoinitiator and/or polymerization catalyst in the photosensitive composition can vary widely depending on the type of reactive monomer, reaction conditions, etc. and can readily be determined by a person skilled in the photographic art. In general, the photo-initiator and/or catalyst component will be present in an amount of from 0 to 0.6% of monomer.

Other additives conventionally used in photosensitive compositions can also be used in the compositions of the present invention. Typically, such additives include chromatic sensitizers that allow adjustment of the wavelength of photopolymerization, polymerization retarders or inhibitors, electron donors, surfactants, plasticizers, etc.

Examples of chromatic sensitizers include thionine, methylene blue, calcozine blue, thioflavine, cresol blue, etc. These compounds can be used in very small amounts to achieve the desired result of shifting the polymerization wavelength, e.g. towards the visible region. Suitable amounts can readily be determined by a skilled person and are generally in the range of from about 0.005 to 0.5% of monomer.

Examples of polymerization inhibitors are well known; several examples being disclosed in Heiart and Leekly et al, mentioned above. Sodium paranitrophenyl acetate is a particularly preferred polymerization inhibitor. These additives, when present in the composition, will generally be present in about the same amount as the photopolymerization catalyst.

Any of the many well known election donors, such as triethanolanine can be used in the present invention.

Anionic, cationic, nonionic or amphoteric surfactants can all be used in the present invention. Similarly, no particular restrictions are placed on the types of plasticizers or other additives such as humectants, fillers, pigments, etc. which can be incorporated into the compositions of the present invention.

Any thermochrome composition which has a distinct color threshold temperature can be used with preference in the present invention.

As non-limitative examples there may be mentioned mixtures of indolic spiropyrans and phenols such as those described in Swiss patent 444,197; mixtures of indolic spiropyrans and certain metallic salts of fatty acids such as those described in Swiss patent 406,257; mixtures of the phenols or metallic salts of fatty acids with benzothiazole spiropyrans instead of indolic spiropyrans, as described in French patent 72 37 857; mixtures of carbazide and a ferric salt, of urea and a lead salt, of zinc thiocarbamate and a fatty acid salt, of a metallic salt and hexamethylene tetramine, of a thioamide derivative and a lead salt, of thiosemicarbazide and a ferric salt, of thiourea with a heavy metal salt, of a hydrazine derivative and a ferric salt, as well as many others described by J. H. Day in Chem. Rev. 63, 65 (1963) and J. Kosar, in *Light Sensitive Systems*, New York, Wiley and Sons (1965) pages 404–414.

The photosensitive element will include the photopolymerizable composition and the thermochromic substance in one or two layers supported on any suitable substrate which presents a flat surface that is sufficiently insulating. In this regard, it will be readily understood that during the passage of the exposed photosensitive element through the high frequency electric field the substrate will undergo uniform heating below the polymerized zones as well as below the unpolymerized zones and therefore the substrate will contribute to the dielectric heating that produces the coloration of the thermochromic substance in the polymerized zones. Such contribution is advantageous in that the time required to reach the threshold temperature, $T_c$, will be correspondingly lowered. However, care must be taken to avoid having the heating from the substrate plus heating from the unpolymerized zones of the exposed film being sufficient to raise the temperature of the unpolymerized zones above $T_c$.

This is most easily accomplished by controlling the duration of heating, i.e. the duration of exposure of the exposed film to the high frequency electric field, for example, by carefully selecting the rate of passage of the exposed film between the electrodes that apply the high frequency electric field.

Any conventionally used substrate for photographic compositions can be used in the present invention, e.g. any natural or synthetic product which can exist in film or sheet form. Suitable support materials for the substrate or base include, for example, paper (including opaque, transparent, waxed, etc.), cotton cloth, cellulosic esters, foil, plasters, etc. The substrate should be flexible and preferrably is capable of being wound on a spool. The substrate can be transparent or non-transparent. The plastic materials, particularly polyesters are the preferred substrate materials since their dielectric constant does not vary as much as other materials as a function of take-up of moisture.

The photosensitive composition of the photopolymerizable composition and the thermochrome is coated on the substrate in a single layer or as two separate superposed layers with the photopolymerizable system in one and the thermochrome in the other by any conventional coating means, such as a coating knife, air blade, Meyer rule, calenders, etc.

When a single layer is employed the composition containing both the photopolymerizable monomer and thermochromic substance will be applied to the substrate at a rate of about 2 g/m² to about 20 g/m² to provide a dried coating containing about 60% of photopolymerizable monomer and about 40% of thermochrome composition.

Where separate layers of photopolymerizable composition and thermochrome composition are applied to the substrate the former will preferably be applied first at a rate of about 1.2 g/m² to about 18 g/m² and, after drying, the second layer containing the thermochrome substance will be applied at a rate of about 0.8 g/m² to about 10 g/m².

The accompanying FIGURE schematically illustrates the process and apparatus of the present invention.

In this FIGURE, numeral 1 represents the object to be photographed; 2 is the image of this subject furnished by objective 3 through shutter 4; 5 is the supply spool of unexposed photographic element 6 according to the invention and 7 is the windoff spool for the exposed photographic element 8; 9 and 10 are electrodes disposed opposite each other on either side of exposed element 8, serving to apply thereto a high frequency electric field furnished by generator 11, controlled by regulator 12 and supplied by power source 13. The power supply remains on, but the high frequency is only connected during the development period.

In accordance with the photosensitive elements and process of the present invention, good quality reproductions can be obtained using high frequency generators having an effective output power of from 2 to 15 watts. The rate of passage of the exposed film between the electrodes should be on the order of aobut 10 to 1000 cm per second depending on the coloration threshold temperature, photopolymerizable system, etc. The preferred rate of passage is about 1 meter per second. Appropriate frequencies are generally from about 10 to 100 megacycles, per second, preferably 22 to 50 megacycles per second. Particularly good results are obtained with a frequency of about 50 megacycles and a rate of passage of about 1 meter per second.

These values were used with the photosensitive elements described in the following examples to provide clear images having the indicated colors. In these examples the order of magnitude of the parameters involved in formula (I) above were as follows:

$E \approx 10 \text{ KV}$
$\epsilon \sim 2.5\text{--}5.5$
$\delta \sim 0.03 \, (\cos \Theta)$
$d = 10 \text{ microns}$ Of course, the values of these parameters are merely indicative and will vary considerably from one composition to another; appropriate selection of these parameters can be readily obtained by simple experimentation.

The light source for the light exposure of the photopolymerizable system can be any suitable source of actinic rays including both visible and ultraviolet depending on the type of photopolymerizable monomer or monomers, type of photoinitiator of catalyst, if any, type of chromatic sensitizers, if any, etc. One can, for example, make use of a Philips lamp type HP 125.

The light source will generally be from 2.5 cm to 25 cm from the photosensitive element and will be applied for about 0.02 to 10 seconds, depending on the degree of polymerization desired, photopolymerizable system, etc.

It is further apparent that by careful regulation of the difference between the temperature of the polymerized zones and threshold temperature $T_c$, it is possible to control contrast and density of the images.

The following non-limitative examples are presented to further illustrate the present invention.

EXAMPLE 1

This example illustrates preparation of a photographic element that bears an emulsion in two layers, yielding a black image.

A white support paper weighing 45 g/m² is first coated with a 12 g/m² layer of a composition constituted by:

| | |
|---|---|
| acrylamide (monomer) | 8 g |
| triethanolamine (electron doner) | 0.3 g |
| thionine (chromatic sensitizer) | 5 mg |
| polyvinyl alcohol (binder) | 15 g |
| glycerol (plasticizer) | 5 cc |
| water | 100 g |

The paper is then dried and covered with a layer weighing 4.5 g/m², of the following composition:

| | | |
|---|---|---|
| lead acetate ⎤ | | 6 g |
| thiourea | (thermochrome composition) | 5 g |
| acetic acid ⎦ | | 0.5 g |
| polyvinyl alcohol | (binder) | 7 g |
| water | | 100 g |

Temperature $T_c$ which corresponds to the threshold of coloration of this emulsion is about 165°C.

EXAMPLE 2

This example illustrates preparation of a single-layer photographic element, yielding a black image, presenting a coloration threshold at a temperature $T_c$ of about 150°C.

A polyester sheet weighing 40 g/m² is coated with a layer of 14 g/m² of a composition that comprises:

| | |
|---|---|
| barium diacrylate (monomer) | 1.54 mole |
| methylene blue (chromatic sensitizer) | 0.001 mole |
| sodium paratoluene sulfinate (polymerization catalyst) | 0.008 mole |
| silver nitrate ⎱(thermochrome⎱ | 0.015 mole |
| orthobenzoic sulfimide⎰ composition ⎰ | 0.01 |
| hydroxyethyl cellulose (binder) | 1.15 g |
| water | 100 g |

EXAMPLE 3

This example illustrates preparation of a photographic element bearing a two-layer emulsion yielding a dark blue image, and having a threshold temperature $T_c$ of about 120°C.

A sheet of white paper serving as support and weighing 50 g/m² is coated with a 12 g/m² layer of the following composition, whereof the pH is set at 6.7 before the coating:

| | |
|---|---|
| acrylamide (monomer 1) | 4.8 mole |
| N,N'-methylenebisacrylamide (monomer 2) | 0.35 mole |
| barium diacrylate (monomer 3) | 0.46 mole |
| sodium paratoluene sulfinate (catalyst) | 0.02 mole |
| calcozine blue (chromatic sensitizer) | $1.6.10^{-4}$ mole |
| water | 100 g |

The paper is then dried and covered with a layer of 4.5 g/m² of the following composition:

| | |
|---|---|
| 6'-chloro-8'-methoxybenzoindolinospiropyran ⎤ | 15 g |
| 4,4'-isopropylidene diphenol (thermochrome⎞ | 65 g |
| calcium stearate ( composition )⎦ | 5 g |
| polyvinyl alcohol hydrolyzed to 98% (binder) | 15 g |

EXAMPLE 4

This example illustrates preparation of a photographic element bearing a two-layer emulsion and yielding a black image, with a $T_c$ of about 180°C.

A white 45 g/m² paper is covered with a 12 g/m² layer of the following composition:

| | |
|---|---|
| barium diacrylate (monomer) | 2 mole |
| thioflavine (chromatic sensitizer) | 0.0001 mole |
| sodium paratoluene sulfinate (catalyst) | 0.01 mole |
| sodium paranitrophenyl acetate (polymerization retarder) | 0.01 mole |
| polyvinyl alcohol (binder) | 10 g |
| water | 100 g |

The layer is dried and covered with a second 4.5 g/m² layer of the followig composition:

| | |
|---|---|
| bismuth oxychloride⎤ | 261 g |
| tin tartrate | 130 g |
| semicarbazide ⎱(thermochrome ⎞ | 200 g |
| diphenylamine ⎰ composition ⎠ | 200 g |
| di-isopropylamine ⎦ | 100 g |
| Pliolite S 7 (binder, styrene butadiene copolymer manufactured by Goodyear, Akron, Ohio, US) | 20 g |
| toluene | 200 g |

EXAMPLE 5

This example illustrates preparation of a photographic element bearing an emulsion with two distinct layers, yielding a brown (sepia) image, with a $T_c$ of about 110°C.

A white paper weighing 50 g/m² is coated with a 12 g/m² layer of the following composition:

| | |
|---|---|
| barium acrylate and lead acrylate (3:1) (monomer 1) | 2.1 mole |
| acrylamide (monomer 2) | 2.6 mole |
| sodium paratoluene sulfinate (catalyst) | 0.017 mole |
| sodium paranitrophenylacetate (polymerization retarder) | 0.017 mole |
| cresol blue (chromatic sensitizer) | $3.7.10^{-4}$ mole |
| Maprenal (thermosetting binder manufactured by Hoechts Cassella) | 30 g |
| water | 100 cc |

This layer is first dried and then coated with a second 4.5 g/m² layer of the following composition:

| | |
|---|---|
| silver behonate ⎛thermochrome ⎞ ⎤ | 350 mg |
| calcium stearate⎝ composition ⎠ | 300 mg |
| spiro [methyl-2 naphtho-3 H(2,1-b)-pyran-3,2' methoxy-6'-methyl-3'-benzothiazoline] ⎦ | 200 mg |
| polyvinyl alcohol (15% solution) (binder) | 2.3 g |
| Armac 18 B (surfactant sold by Industrie Biologique Francaise) | 3.5 mg |
| water | 2.25 g |

EXAMPLE 6

This example again illustrates preparation of a photographic element bearing a two-layer emulsion, yielding a dark blue image, with a T of about 120°C.

A white 45 g/m² paper is coated with a 12 g/m² layer of the following composition:

| | |
|---|---|
| barium acrylate (monomer 1) | 1.6 mole |
| acrylamide (monomer 2) | 1.6 mole |
| sodium paratoluene sulfinate (catalyst) | 0.01 mole |
| thionine (chromatic sensitizer) | 0.005 mole |
| water | 100 g |
| gelatin, in an amount that represents 2.6% by weight of the composition (binder) | |

The paper is dried and covered with a second 4.5 g/m² layer of the following composition:

| | |
|---|---|
| calcium resinate (thermochrome composition)⎤ | 550 g |
| cobalt naphthenate | 100 g |
| spiro [methyl-3-naphtho-3H-(2,1-b)-pyran-3, 2'-methyl-3'-benzothiazoline] ⎦ | 330 g |
| polyvinyl alcohol hydrolyzed to 88% (binder | 2215 g |
| Armac 18D (surfactant) | 8.5 g |
| water | 2250 g |

The process, apparatus and compositions of the present application have found their greatest utility in connection with identity photograph establishments using automatic apparatus. However, there are many other applications in the field of photographic reproduction in which the present invention can be used.

I claim:
1. A photographic process comprising
   a. providing a photosensitive element comprising a substrate, and a photosensitive composition on said substrate, said composition comprising a photopolymerizable system dispersed in a binder and a thermochromic substance;
   b. exposing said photosensitive element with light according to an image having transparent areas and non-transparent areas to thereby cause polymerization of said photopolymerizable system only in those areas corresponding to the transparent areas of said image; and c. passing said exposed photosensitive element through a high frequency electric field to selectively heat said polymerized areas to a temperature above the threshold temperature of said thermochrome whereby said thermochrome changes from a colorless or weakly colored form to a colored, stable form.

\* \* \* \* \*